(12) United States Patent
Broussev et al.

(10) Patent No.: US 11,552,594 B2
(45) Date of Patent: Jan. 10, 2023

(54) OSCILLATOR FREQUENCY RANGE EXTENSION USING SWITCHED INDUCTOR

(71) Applicant: Intel Corporation, Santa Clara, CA (US)

(72) Inventors: Svetozar Broussev, Linz (AT); Igor Gertman, Petch Tikva (IL); Eyal Goldberger, Moshav Beherotaim (IL); Run Levinger, Tel Aviv (IL); Ron Pongratz, Tel Aviv (IL); Anat Rubin, Kfar Saba (IL)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 16/957,349

(22) PCT Filed: Mar. 30, 2018

(86) PCT No.: PCT/US2018/025429
§ 371 (c)(1),
(2) Date: Jun. 23, 2020

(87) PCT Pub. No.: WO2019/190553
PCT Pub. Date: Oct. 3, 2019

(65) Prior Publication Data
US 2020/0336103 A1  Oct. 22, 2020

(51) Int. Cl.
*H03B 5/12* (2006.01)
*H01F 17/00* (2006.01)
(Continued)

(52) U.S. Cl.
CPC ....... *H03B 5/1268* (2013.01); *H01F 17/0006* (2013.01); *H01F 21/12* (2013.01);
(Continued)

(58) Field of Classification Search
CPC .. H03B 5/1268; H03B 5/1215; H03B 5/1228; H03B 5/1256; H03B 5/1218;
(Continued)

(56) References Cited

U.S. PATENT DOCUMENTS 10,862,424 B2 * 12/2020 Ying .................. H03B 5/1228
2006/0033602 A1 * 2/2006 Mattsson ............ H01F 17/0006
336/200

(Continued)

OTHER PUBLICATIONS

"International Application Serial No. PCT US2018 025429, International Preliminary Report on Patentability dated Oct. 15, 2020", 11 pgs.

(Continued)

*Primary Examiner* — Jeffrey M Shin
(74) *Attorney, Agent, or Firm* — Schwegman Lundberg & Woessner, P.A.

(57) ABSTRACT

An inductive switch comprises an inductor that has a primary metallic winding having a boundary configured in shape of a figure eight, such as in two loops, and a plurality of secondary metallic windings arranged within the boundary of the primary metallic winding. The inductive switch includes a plurality of switches, each switch arranged in series with a respective one of the plurality of secondary metallic windings. An equal number of the secondary windings is arranged within each loop. A tunable inductor comprises at least one main metallic loop and at least one secondary metallic loop, wherein the at least one secondary metallic loop comprises a switch that is arranged to configure the at least one secondary metallic loop into at least one shorted metallic loop or at least one closed metallic loop. The at least one shorted loop is floating.

11 Claims, 16 Drawing Sheets

(51) Int. Cl.
  *H01F 21/12* (2006.01)
  *H01F 27/28* (2006.01)
(52) U.S. Cl.
  CPC ....... *H01F 27/2804* (2013.01); *H03B 5/1218* (2013.01); *H03B 5/1256* (2013.01); *H01F 2021/125* (2013.01)
(58) Field of Classification Search
  CPC .... H01F 17/006; H01F 21/12; H01F 27/2804; H01F 2021/125
  See application file for complete search history.

(56) References Cited

U.S. PATENT DOCUMENTS

| | | |
|---|---|---|
| 2010/0066473 A1 | 3/2010 | Fahs |
| 2011/0051308 A1* | 3/2011 | Chan ...................... H01F 21/12 361/268 |
| 2012/0244802 A1 | 9/2012 | Feng et al. |
| 2015/0065068 A1 | 3/2015 | Mattsson et al. |
| 2017/0179917 A1 | 6/2017 | Leuschner et al. |
| 2018/0261369 A1* | 9/2018 | Mattsson ................ H01L 28/10 |
| 2019/0089304 A1* | 3/2019 | Moslehi Bajestan ... H01F 21/12 |

OTHER PUBLICATIONS

"International Application Serial No. PCT/US2018/025429, International Search Report dated Dec. 26, 2018", 4 pgs.
"International Application Serial No. PCT/US2018/025429, Written Opinion dated Dec. 26, 2018", 9 pgs.

* cited by examiner

OSCILLATOR FREQUENCY RANGE EXTENSION USING SWITCHED INDUCTOR

This patent application is a U.S. National Stage Filing under 35 U.S.C. 371 from International Application No. PCT/US2018/025429, filed Mar. 30, 2018 and published in English as WO 2019/190553 on Oct. 3, 2019, which is hereby incorporated by reference herein in its entirety.

TECHNICAL FIELD

Aspects of the subject matter disclosed herein generally relate to an efficient way to realize an inductive switching concept that can be used in RF circuitry such as, among things, in a voltage controlled oscillator (VCO) or a digitally controlled oscillator (DCO) using an 8-shaped inductor. Other aspects include a variable inductor using switched current loops.

BACKGROUND

Inductive switching is typically used in conjunction with a standard circular/octagonal/square inductor to increase the tuning range of oscillators. However, in crosstalk-optimized inductors (e.g. 8-shaped inductors), the straight-forward implementation of inductive switching does not produce the desired effect. An efficient and practical way to overcome this limitation is needed.

DETAILED DESCRIPTION

Figure 1A:
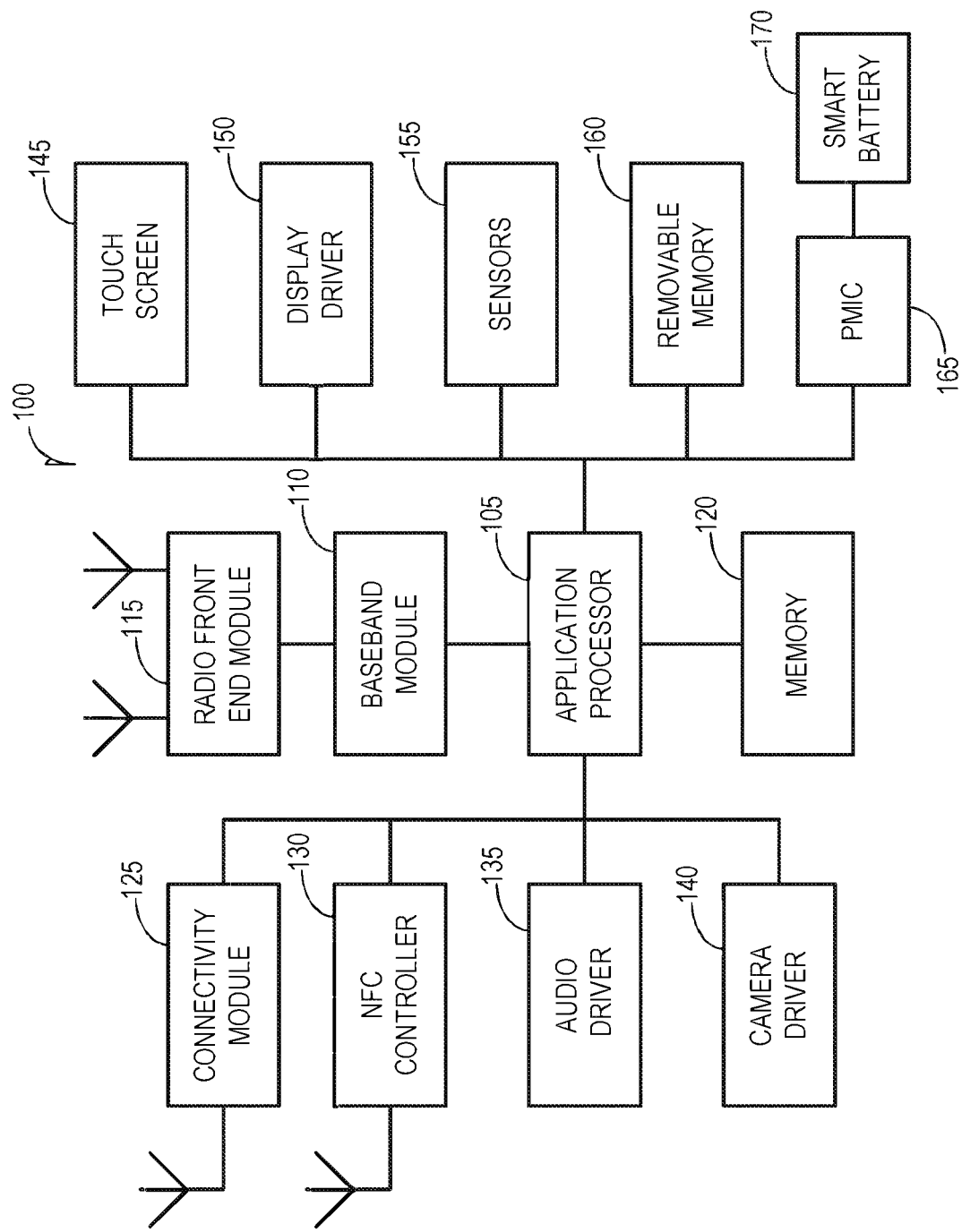
FIGS. 1A and 1B illustrate a wireless mobile device and a base station, respectively, in accordance with some aspects.

FIG. 1A illustrates a mobile device 100 in accordance with an aspect. The user device 100 may be a mobile device in some aspects and includes an application processor 105, baseband processor 110 (also referred to as a baseband sub-system), radio front end module (RFEM) 115, memory 120, connectivity sub-system 125, near field communication (NFC) controller 130, audio driver 135, camera driver 140, touch screen 145, display driver 150, sensors 155, removable memory 160, power management integrated circuit (PMIC) 165 and smart battery 170.

In some aspects, application processor 105 may include, for example, one or more CPU cores and one or more of cache memory, low drop-out voltage regulators (LDOs), interrupt controllers, serial interfaces such as serial peripheral interface (SPI), inter-integrated circuit (I²C) or universal programmable serial interface circuit, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband processor 110 may be implemented, for example, as a solder-down substrate including one or more integrated circuits, a single packaged integrated circuit soldered to a main circuit board, and/or a multi-chip module containing two or more integrated circuits.

Figure 1B:
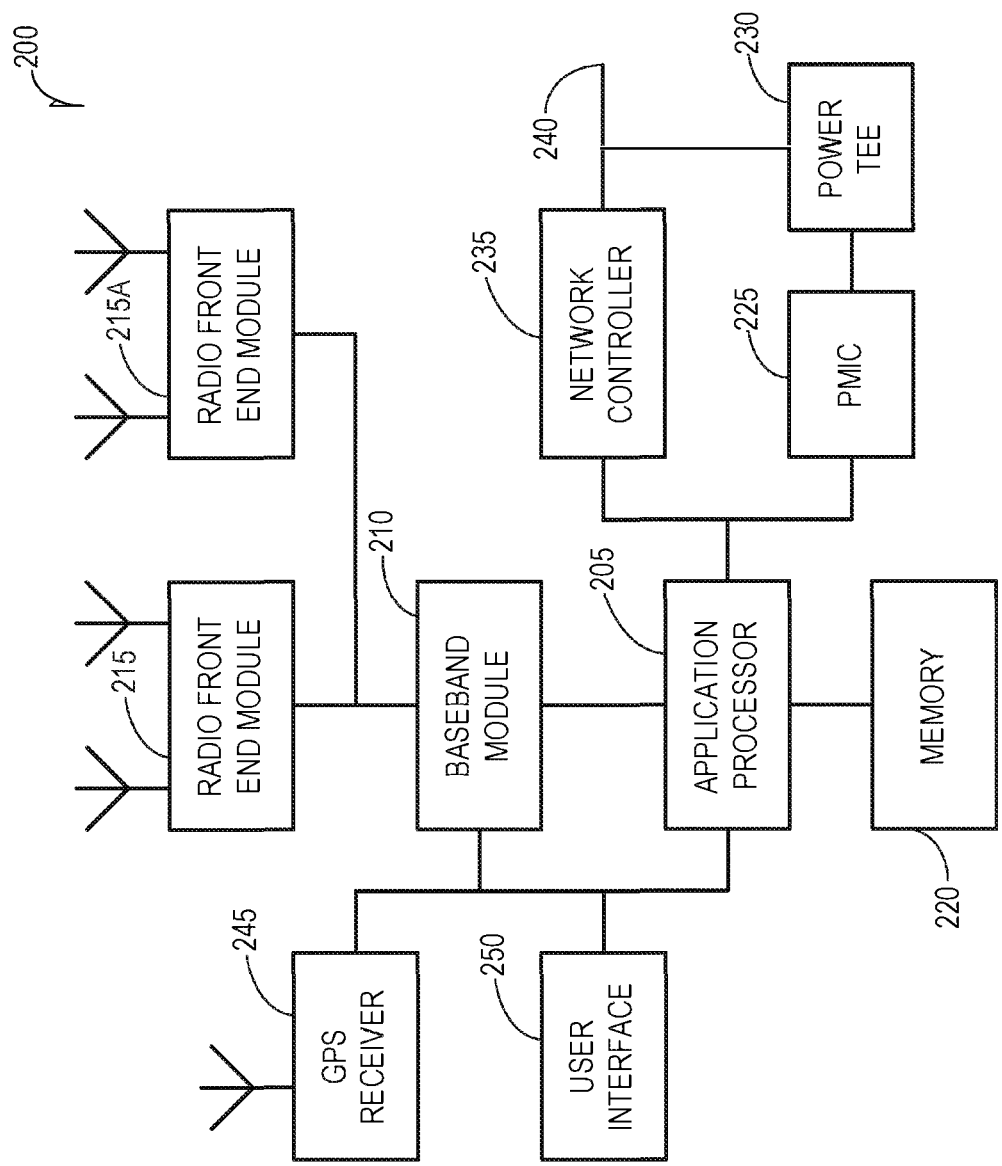

FIG. 1B illustrates a base station or infrastructure equipment radio head 200 in accordance with an aspect. The base station radio head 200 may include one or more of application processor 205, baseband processor 210, one or more radio front end modules 215, memory 220, power management circuitry 225, power tee circuitry 230, network controller 235, network interface connector 240, satellite navigation receiver 245, and user interface 250.

In some aspects, application processor 205 may include one or more CPU cores and one or more of cache memory, low drop-out voltage regulators (LDOs), interrupt controllers, serial interfaces such as SPI, I2C or universal programmable serial interface, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip module containing two or more integrated circuits.

In some aspects, memory 220 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable to provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide data to application processor 205 which may include one or more of position data or time data. Application processor 205 may use time data to synchronize operations with other radio base stations.

In some aspects, user interface 250 may include one or more of physical or virtual buttons, such as a reset button, one or more indicators such as light emitting diodes (LEDs) and a display screen.

Figure 2:
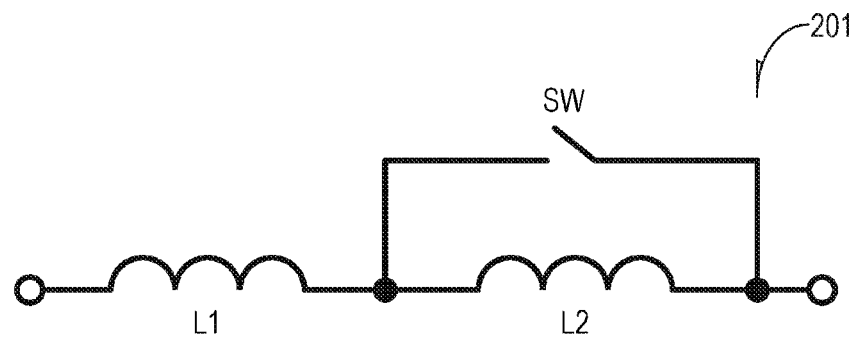
FIG. 2 illustrates basic inductive switching.

A DCO/VCO such as those discussed above may implement inductive switching. There are various types of inductive switching. FIG. 2 illustrates basic inductive switching. In inductive switch 201, inductors L1 and L2 are in series. A switch SW is placed in parallel with an inductor L2. If the switch is on or closed, the effective inductance is equal to L1. On the other hand, if the switch is off or open, the effective inductance is equal to L1+L2. The switch in FIG. 2 is usually realized with N-type metal oxide silicon (NMOS) transistors, P-type metal oxide (PMOS) transistors, or both. There are several disadvantages with inductive switching as illustrated. For one thing, the on-resistance of the switch negatively impacts the quality factor of the inductor. A tradeoff is made between the size of the switch and the inductor quality factor. A larger metal oxide silicon (MOS) switch, N-type or P-type, leads to a better quality factor, but reduces the tuning range of the oscillator. In addition, the switch is dc-coupled to the inductor. Thus the preferred switch topology (NMOS or PMOS) depends highly on the outside circuitry and/or oscillator with which the switch is used.

Figure 3:
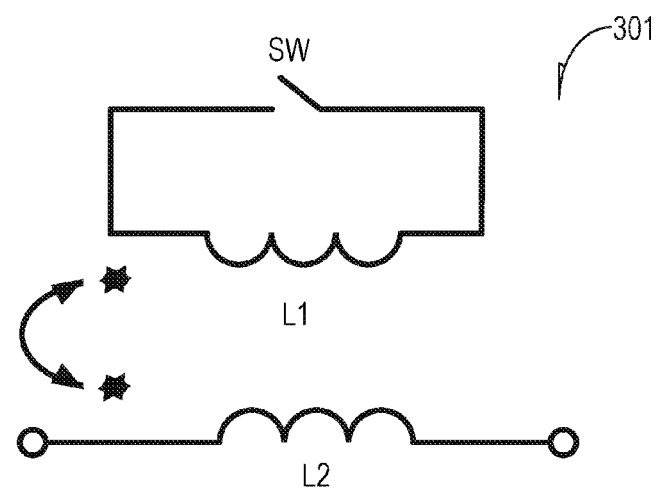
FIG. 3 illustrates a basic transformer switch.

FIG. 3 illustrates a basic transformer switch. The transformer switch 301 shown in FIG. 3 is similar to that of FIG. 2. L1 is the secondary winding of a transformer and L2 is the secondary winding of the transformer. A switch SW is placed in parallel with the secondary winding L2 of the transformer. If the switch SW is open, the effective inductance is equal to L1. On the other hand, if the switch is closed, the effective inductance reduces to a value that is function of L2 and of the mutual coupling between the two inductors L1 and L2. As with FIG. 2, the switch can be realized with NMOS transistors, PMOS transistors, or both. The preferred device is usually the one giving the lowest channel resistance. One advantage of the transformer switch illustrated in FIG. 3, compared to the inductive switch illustrated in FIG. 2, is the decoupled DC biasing of the switch from the actual circuit. In this way, a unified switch be implemented, which is not influenced by the oscillator implementation. Another advantage compared to the inductive switch illustrated in FIG. 2 is the additional degree of freedom for design given by the mutual coupling. For instance, this extra degree of freedom allows one to modify the effective inductance by placing the secondary transformer winding L2 closer to, or farther away from, the main transformer winding L1. This advantage addresses the disadvantage discussed above with respect to the basic inductive switch of FIG. 2, namely that the ratio of L1/L2 of the basic inductive switch cannot be arbitrarily chosen in practice. There are, however, disadvantages with respect to the basic transformer switch of FIG. 3. One disadvantage is that a transformer layout is in general somewhat more complex for physical realization than a standard inductor. A second disadvantage is that because of the isolated DC biasing of the MOS switch, a dedicated biasing network is required. The additional network could consume more silicon area, and it could inject additional noise into the oscillator with which or within which the switch is used.

Figures 4A, 4B:
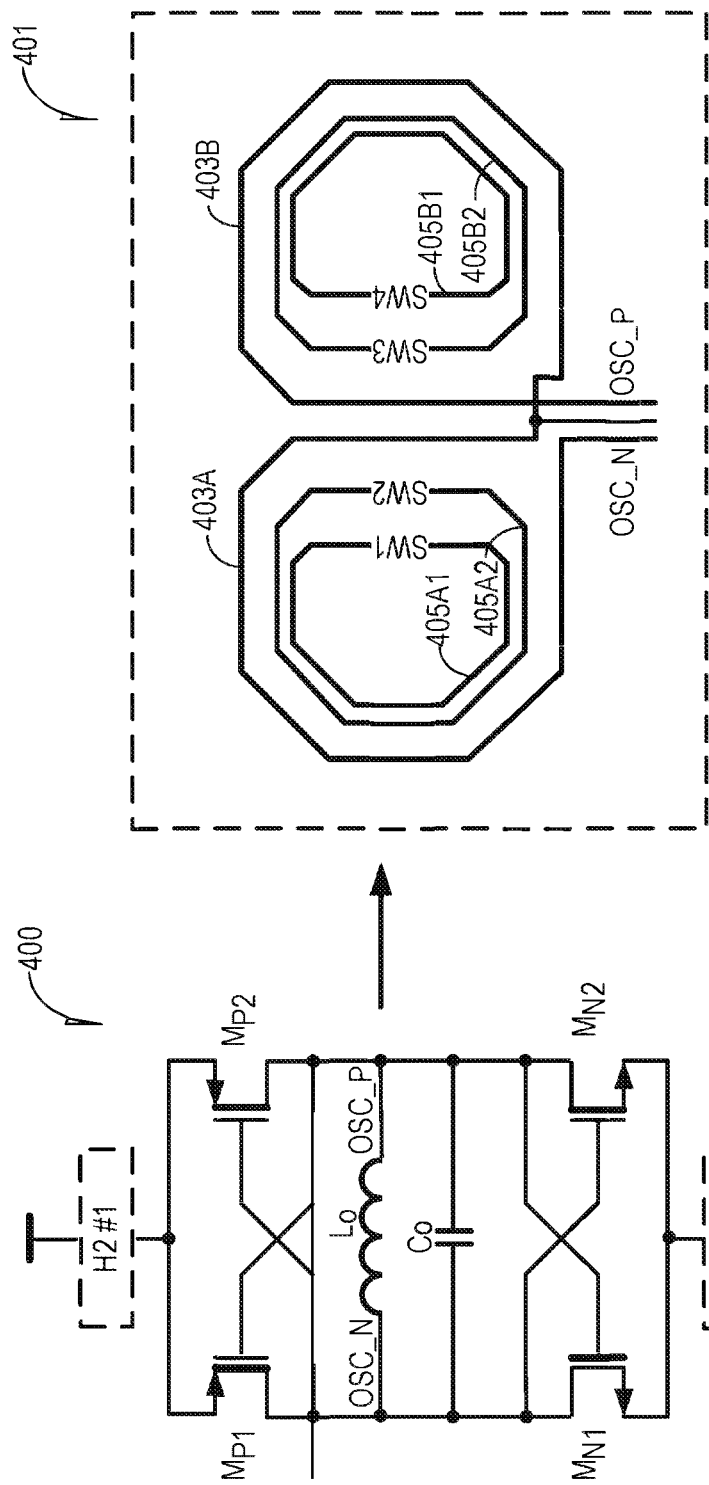
FIG. 4A illustrates a generic DCO Block diagram, according to some aspects.
FIG. 4B illustrates an inductor switching concept for the DCO of FIG. 3A applied in an 8-shaped inductor, according to some aspects.

The implementations discussed in FIGS. 2 and 3 can have crosstalk issues. The disclosed device shows an efficient implementation for an 8-shaped inductor. An 8-shaped inductor is a preferred from crosstalk point of view, resulting in less crosstalk in some aspects. FIG. 4A illustrates a generic DCO Block diagram, according to some aspects. The generic DCO is built upon a double-cross coupled architecture, but the disclosed subject matter below is applicable to essentially all LC type of oscillators. The negative conductance is realized with the transistors $M_{N1}$, $M_{N2}$, $M_{P1}$, and $M_{P2}$ of FIG. 4A. The two cross-coupled pairs of transistors (NMOS and PMOS) are degenerated (referring to a local feedback, or common-mode impedance placed for the switch pair) with two dedicated H2-networks, namely H2#1 and H2#2. The use of an H2 network is a commonly used technique for improving oscillator phase noise in providing high impedance tuned at twice the oscillator frequency. The H2 network depicted in FIG. 4A is for illustrative purposes. The H2-networks could be built with an LC tank, MOS transistors, resistors, or even shorts to VDD (drain) and/or VSS (source). The capacitor C0 represents the effective capacitance of the resonance tank $L_0C_0$. The inductor L0 represents the effective inductance of the resonance tank $L_0C_0$.

FIG. 4B illustrates an inductor switching concept for an RF circuit such as, in some aspects, the DCO of FIG. 4A, applied in an 8-shaped inductor, according to some aspects. FIG. 4A illustrates a generic LC oscillator topology, while FIG. 4B illustrates the employing of an inductive switching concept using an 8-shaped inductor 401. As shown in FIG. 49, the inductor is realized as a transformer whose primary winding 403A, 403B has an 8-shaped geometry, while the secondary winding 405A1, 405A2-405B1, 405B2 is split into number of separate inner windings 405A1 and 405A2, and also 405B1 and 405B2. Each inner winding has a serial switch (noted with SW1-SW4), which could shorten the winding, or keep the winding open. By switching on/off the inner windings, the effective tank inductance is modified and therefore the DCO frequency is changed.

While general inductive switching is known, as discussed above, significant improvements that overcome the above disadvantages can be achieved by the inductive switching concept using 8-shaped inductors as discussed below. In particular, in the disclosed subject matter, the asymmetrical secondary windings placement provides effective inductance switching, while the crosstalk properties of the 8-shaped inductor are preserved. One advantage of this disclosure is DCO count reduction (equivalent to transceiver area reduction) by virtue of providing a wider frequency range from a single DCO instead of using two separate DCOs. Further, the disclosed subject matter does not result in any significant silicon area penalty, since all components of the switch may be placed inside the main inductor. Further, as mentioned above, the crosstalk properties of the 8-shaped inductor are preserved. That the disclosed subject matter is an efficient and practical implementation of an inductive switching concept has been verified by measurements, discussed below. While DCO frequency extension could be realized also by enlarging the capacitance with switch on, to capacitance with switch off ratio (Con/Coff) of the capacitor bank in the DCO, this results in quality factor (Q) degradation and phase noise penalty seen across the entire DCO range. The inductive switching disclosed herein, on the other hand, displays quality factor (Q) degradation and phase noise penalty only when the switches are on (i.e., only for the frequency range above the normal DCO tuning range).

Figure 5:
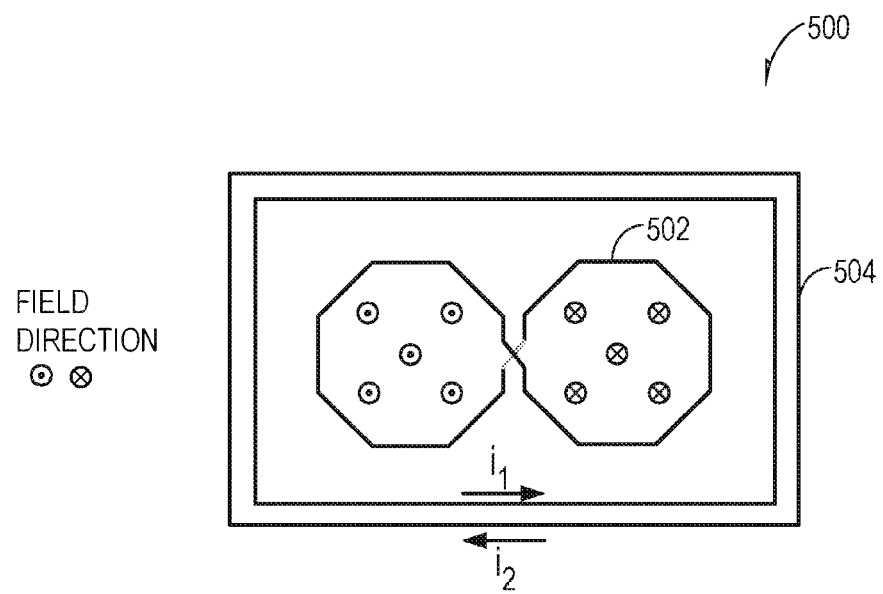
FIG. 5 is an example of problems encountered with 8-shaped inductor switching.

FIG. 5 is an example of problems encountered with 8-shaped inductor switching. In FIG. 5, inductor switch 500 comprises an 8-shaped inductor 502 surrounded by metal ring 504. The ring 504 could be viewed as a shorted secondary transformer winding, while the 8-shaped inductor 502 could be viewed as a primary transformer winding in a transformer switch. However, because of the nature of the 8-shaped inductor, one half of the inductor will induce Eddy current $i_1$ with a given polarity, while the second half of the same inductor will induce Eddy current $i_2$ with an opposite polarity. In effect, the two currents $i_1$ and $i_2$ will cancel each other, and therefore the ring around the inductor will not influence its equivalent inductance. In fact, this illustrates the same crosstalk property of the 8-shaped inductor: an 8-shaped inductor is more immune to external magnetic interferences and it generates less magnetic disturbance compared to a standard inductor.

The intention of the simple example in FIG. 5 is to illustrate that direct and arbitrary application of an inductive switching concept is not straight-forward for an 8-shaped inductor.

Figure 6:
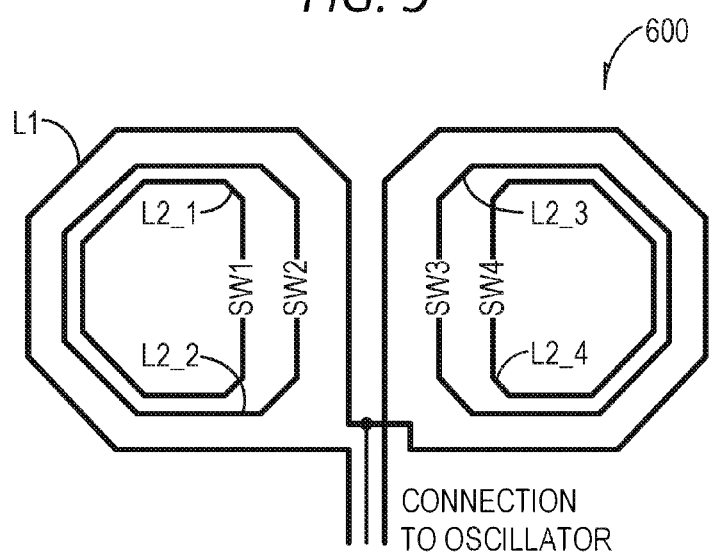
FIG. 6 illustrates an inductive switch using an 8-shaped inductor with fully enclosed concentric auxiliary windings, according to some aspects.

FIG. 6 illustrates an inductive switch using an 8-shaped inductor with fully enclosed concentric auxiliary windings, according to some aspects. In the 8-shaped inductor of FIG. 6, L1 is the primary winding of the transformer. The secondary transformer windings, L2_1-L2_4, (four in this example) are placed inside the 8-shaped inductor openings. The main principle utilized here is that each secondary winding is placed asymmetrically to the primary winding such that a full eddy current cancellation does not take place (as it does in the example of FIG. 5). The position illustrated for asymmetrical the windings are respectively inside each 8-shaped inductor opening, as shown in FIG. 6 The switches SW1-SW4 that shorten the secondary windings are also located inside the 8-shaped inductor.

In order to retain the crosstalk property of the 8-shaped inductor, the secondary windings from the two inductor openings should be switched on/off simultaneously (e.g., SW1 and SW4 should be switched on/off with a first control signal; SW2 and SW3 should be switched on/off with a second control signal). In addition, all four secondary windings can be configured to be switched on or off at the same time. Switching on/off each individual winding is also possible and not strictly prohibited, but it is expected that the inductor will become asymmetrical with respect to the oscillator, and thus it will negatively impact its phase noise performance.

While the example of FIG. 6 uses four secondary windings, a straight-forward extension of the same principle can be realized with more secondary windings (for example 6, 8, etc.), or with fewer secondary windings (for example 2).

The effective inductance seen by the oscillator to which the 8-shaped inductor switch is connected can be influenced by the mutual coupling between the windings of the 8-shaped switch, which is easy for implementation by changing the physical spacing between the primary and secondary windings of the transformer.

Figure 7A:
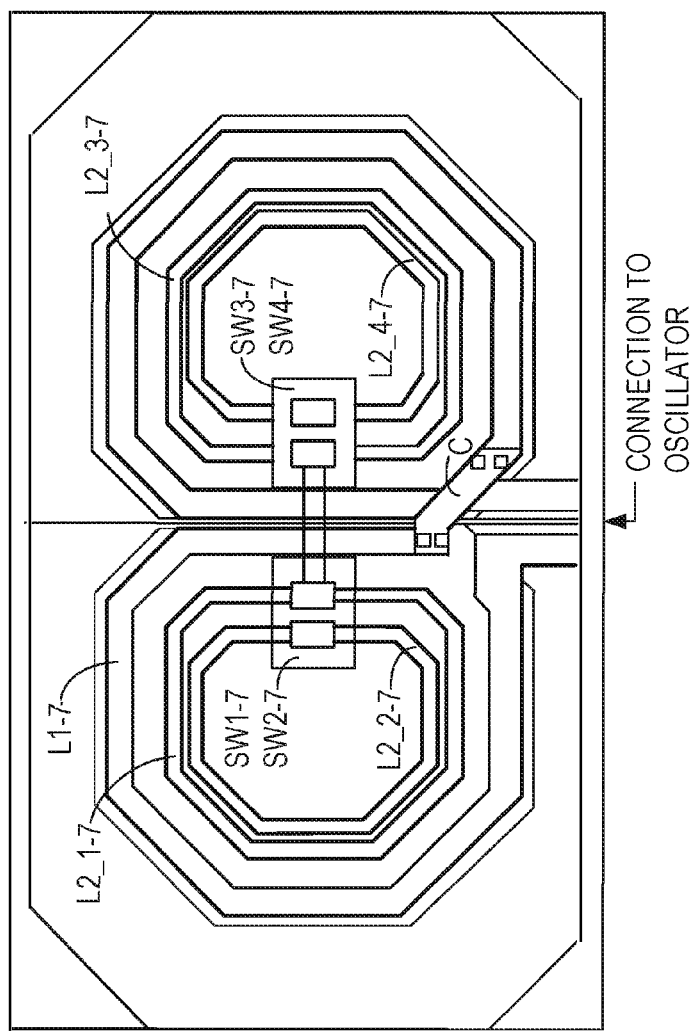
FIG. 7A is a photograph of an 8-shaped inductor from a semiconductor die, according to some aspects.

FIG. 7A is a photograph of an 8-shaped inductor from a semiconductor die, according to some aspects. FIG. 7A is a photograph of the implementation 700 of the inductor 600 in FIG. 6. The reference numerals of FIG. 7 are similar to those in FIG. 6 but are revised for FIG. 7A. In the photograph of FIG. 7A the inductor 700 within the die clearly illustrates the standard chip layers for the primary winding L1-7, with connection C, the four secondary windings, two (L2_1-7, L2_1-7) within the left side outer loop and two L2_3-7 and L2_4-7 within the right outer loop of FIG. 7A, according to some aspects. Similarly switches SW1-7 and SW2-7 within the left outer loop and SW3-7 and SW4-7 within the right outer loop are clearly illustrated. Such implantations can be manufactured using well-known semiconductor manufacturing methods.

Figure 7B:
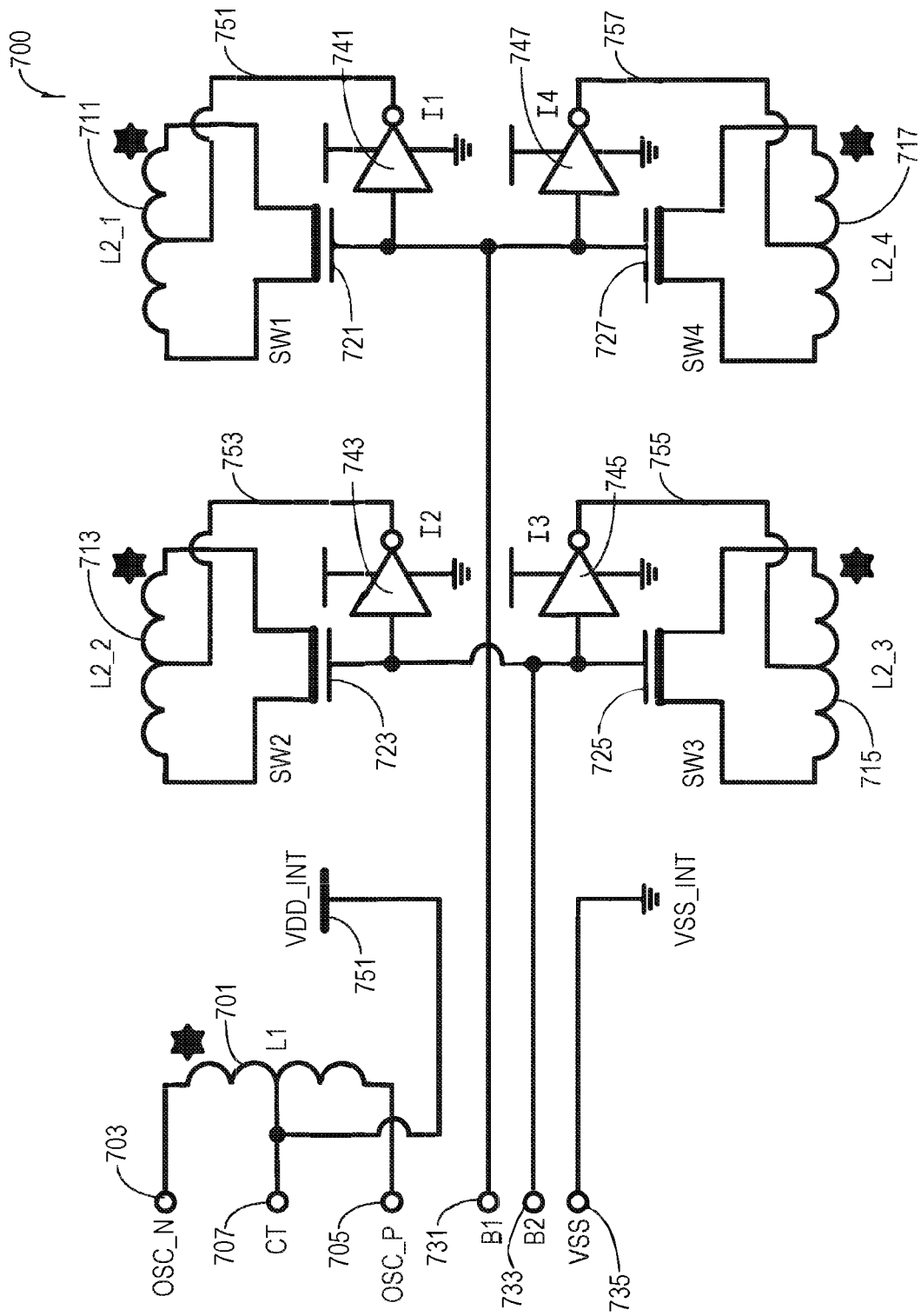
FIG. 7B illustrates a schematic of a switched 8-shaped inductor with fully enclosed concentric auxiliary windings as seen in FIG. 7A, according to some aspects.

FIG. 7B illustrates a schematic 701 of the switched 8-shaped inductors of FIG. 6 and FIG. 7A, with fully enclosed concentric auxiliary windings, according to some aspects. In FIG. 7B the 8-shaped inductor L1 is connected to the differential oscillator nodes "osc_n" 703 and "osc_p" 705, whereas "ct" 707 is the center tap of the inductor L1. In some aspects, secondary winding (L2_1, 711-L2_4 727) may be shorted by a respective NMOS switch (noted as SW1-SW4). In some aspects, the control signals b1 731 and b2 733 connect to the gates for the switching devices SW1-SW4, where b1 controls simultaneously SW1 and SW4, and b2 controls simultaneously SW2 and SW3. In some aspects the control signals b1 and b2 for switches SW1-5W4 may be provided by an automatic frequency control circuit. In some aspects, the control signals b1, b2 may be generated internally in the transceiver based on the frequency band requested from the baseband. The control signal information itself may be stored in a hand-dependent configuration table, which would select the correct DCO, the correct analog settings, and the like, including b1 and b2. In some aspects, this can also be done as soon as the DCO runs out of tuning range. In some aspects, auxiliary inverters I1-I4 provide the DC biasing of the main switching devices: the output of each inverter is connected to the respective center tap of the respective secondary winding via lines 751, 753, 755, 757. When a switch is turned on, a high voltage potential is applied to the gate of the NMOS transistor. Respectively, the inverter provides a voltage potential near ground to the center tap of the secondary winding. Therefore, the maximum gate-source voltage is applied to the respective MOS device 721, 723, 725, 727 in order to achieve the lowest channel on-resistance. Since the respective inverter connects to the center tap of the respective secondary winding 711, 713, 715, 717, which is effectively a virtual alternating current (AC) ground, no special requirements are imposed to inverter devices, thus a minimum-sized inverter can be used. Alternatively, when the switch SW1, SW2, SW3, SW4 is turned off, a low voltage potential is applied to the gate of the respective NMOS transistor 721, 723, 725, 727 while high voltage is applied via the center tap or the respective secondary winding 711, 713, 715, 717 to the drain and source terminals of the respective transistor. This biasing scheme guarantees safe off condition of the switch with a minimized parasitic capacitance of the switch.

The VDD of the inverters I1-I4 (noted as "VDD_INT" in FIG. 7B) could be supplied externally, or the potential of the center tap of the primary winding L1 can be used (the latter is depicted in FIG. 7). The use of the center tap 707, for VDD_INT 751 simplifies the physical realization of the inductor and the oscillator itself.

FIG. 7B shows an NMOS switch in the example realization, since in most silicon technologies, the NMOS transistor provides the smallest channel on-resistance for a given size, respectively, and the smallest parasitic capacitance for a given on-resistance. However, the same principle can be extended to a PMOS switch, a CMOS switch, or other switch configurations, where the DC biasing of the switch is be adapted accordingly.

Figure 8:
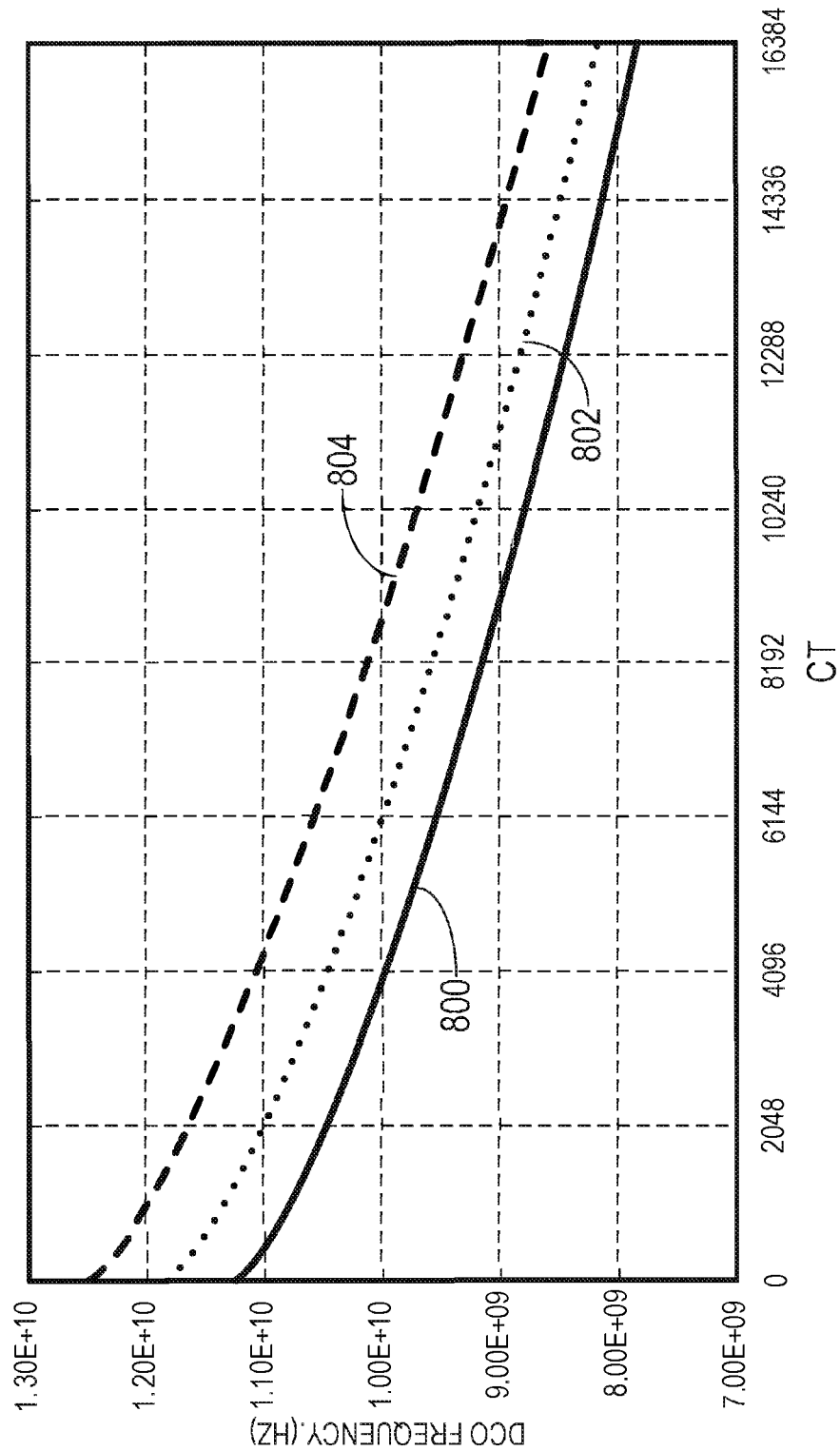
FIG. 8 illustrates measured frequency characteristics of a prototype using the disclosed inductive switching, according to some aspects.

FIG. 8 illustrates measured frequency characteristics of a prototype using the disclosed inductive switching, according to some aspects. In FIG. 7B a measured frequency curve of a DCO using the disclosed inductive switching concept is the vertical coordinate and the DCO course tuning is the horizontal coordinate (CT). The continuous curve 800 corresponds to an oscillator operation with all switches SW1-SW4 in off state, where the effective inductance seen by the oscillator is equal to the inductance of the 8-shaped inductor, or the primary winding of the transformer. The dotted curve 802 corresponds to operation with the inner secondary windings L1_1 and L1_4 being shorted by their respective switches. The shorted windings reduce the effective inductance seen by the oscillator, and thus the frequency of oscillation increases. The dashed curve 804 corresponds to operation with outer secondary windings L1_2 and L1_3 being shorted by their respective switches. Since L1_2 and L1_3 are physically closer to the primary winding L1, the mutual coupling is higher, and thus the result is that the DCO frequency is higher.

As demonstrated in FIG. 8, the upper DCO frequency is extended with more than 1 GHz, which is effectively more than 10% of relative frequency change. The amount of frequency extension is a result of design requirements and optimization.

Radio frequency circuits are often required to be tunable or wideband and selective simultaneously. Some examples are filters, oscillators, tuned amplifiers and matching networks, including LC tanks such as discussed above. However, it is extremely difficult to design wideband circuits due to the tradeoff between Q and bandwidth.

Current solutions include:

Using switched capacitors in order to change matching network/LC tank frequency. In the case of a matching network of a tuned amplifier this method will actually lower the circuit's Q while shifting its peak, but will hardly widen the response. In the case of the LC tank, adding a large capacitor in order to achieve a major shift in frequency will either severely degrade Q (especially at high frequencies) or add significant parasitic capacitance from the switches, which may change the transfer function and performance.

Using a low Q inductor, but this implementation naturally trades off performance with bandwidth.

Using a dual band resonator, but this may allow for high performing circuits but is hard to control and may lead to unwanted oscillations or unplanned modes.

Implementing a variable inductor with a series switch to lower inductance. This implementation has been shown to work for wide band oscillators. However, it is very limited and cannot be used to perform a multitude of tuning possibilities.

Using several parallel inductors and switching between them. This implementation maintains performance but requires significant and costly space.

In some aspects the disclosed subject matter achieves a variable inductor by switching current loops around or within the inductor, thus changing its inductance. Unlike a regular transformer the current loops are either shorted or open. In some aspects, this magnetic loading effect is used on the main inductor. Since the current loops are floating, and not connected to ground, when the current loops are open there is little or no effect to the original inductor (this includes a higher self-resonant frequency (SRF) and a better Q factor), unlike the prior art. Using several loops at different metals and positions, it is possible to get a variable inductor with a multitude of inductance values and little or no size increase. The disclosed subject matter achieves this by using a shield around an inductor, or adding internal ("floating" or not connected to ground) loops within the cavity of the inductor, together with a switch that can close the shield/loops so that coupled current loops can be created in accordance with Lenz's law that creates an induced current that in turn will cancel some of the magnetic flux ("flux"), and thus lower the inductance. When the floating loops are switched to open, there is no induced current within them. Therefore beyond slightly shifting the self-resonance, there will be little or no substantial effect (including Q degradation). This is in contrast to the prior art where either the additional paths are not floating or they are in series to the wanted inductor.

Figure 9:
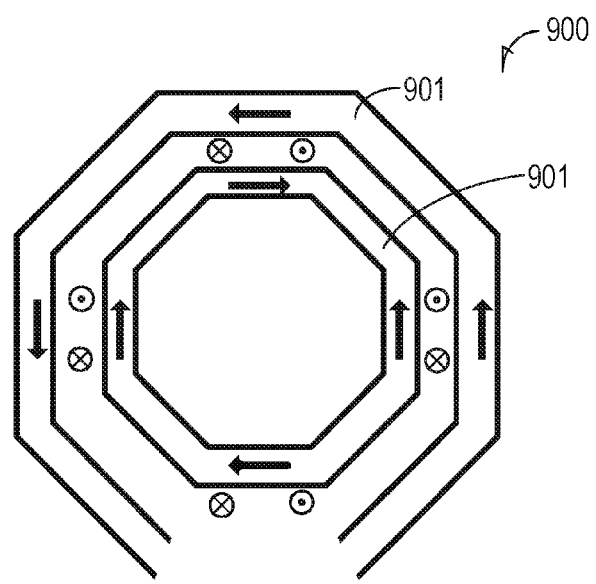
FIG. 9 illustrates an inductor with an added closed loop, according to some aspects.

FIG. 9 illustrates an inductor, 900, with an added closed loop, according to some aspects. Winding 901 is the wanted inductor, sometimes called the main loop, while winding 903 is the added closed loop, sometimes called the current loop, for this aspect. In contrast to other prior art implementations of a switched inductor the added current loop(s) are floating thus allowing an efficient tuning of spiral inductors with little, if any, interference or intervention to the actual physical wanted inductor. In other words, when the switch is open there is hardly any effect to the added metal (either within or outside of the inductor). Additionally, this invention can be implemented in such a manner so that it consumes little if any additional silicon space, and can take advantage of allocated space for shielding. In other words, adding internal loops within the inductor can create coupled current loops in accordance with Lenz's law.

As can be seen from equations (1) through (5) below, with respect to FIG. 9:

$$\varepsilon = -\frac{d\varphi}{dt} \quad (1)$$

$$I = \frac{\varepsilon}{r} = -\frac{1}{r}\frac{d\varphi}{dt} \quad (2)$$

$$B_{cancel} = -\frac{\mu_0}{2R}\frac{1}{r}\frac{d\varphi}{dt} \quad (3)$$

$$\varphi_{cancel} = -\frac{\pi R^2 \mu_0}{2}\frac{1}{r}\frac{d\varphi}{dt} \quad (4)$$

$$L_{wloop} = \frac{\Phi}{I} = \frac{L_{woloop}(\varphi + \varphi_{cancel})}{\varphi} = \frac{L_{woloop}\left(\varphi - \frac{\pi R^2 \mu_0}{2}\frac{1}{r}\frac{d\varphi}{dt}\right)}{\varphi} \quad (5)$$

Where
r is resistance;
R is the distance to the observer (i.e. the distance from the field's source);
$B_{cancel}$ is the magnetic field exerted by the current loop;
μ0 is the permittivity in vacuum;
$\psi_{cancel}$ is the magnetic flux created by the current loop;
$L_{w0loop}$ is the inductance without the presence of the current loop; and
$L_{wloop}$ is the inductance with the presence of the current loop.

It can be seen from the above analysis that when r approaches infinity, the
inductance value of the inductor is the unaltered value of the inductance. As r approaches zero, the value of the inductance can be varied.

Figure 10:
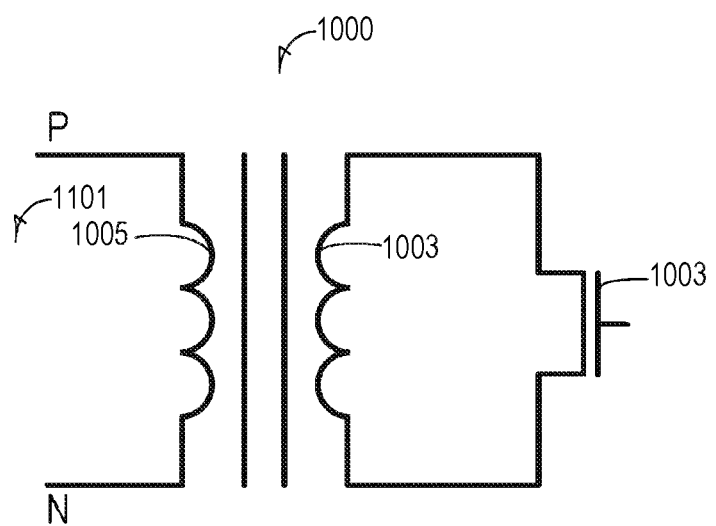
FIG. 10 illustrates an inductor with additional current loops modeled as a transformer where one side of the transformer is connected to a transistor, according to some aspects.

FIG. 10 illustrates an inductor with additional current loops modeled as a transformer 1000 where one side of the transformer 1001 is connected to a transistor 1003, according to some aspects. In FIG. 10 the other side of the transformer may be connected to appropriate RF circuitry, or any other circuit where there is a need for variable inductance.

Figure 11A:
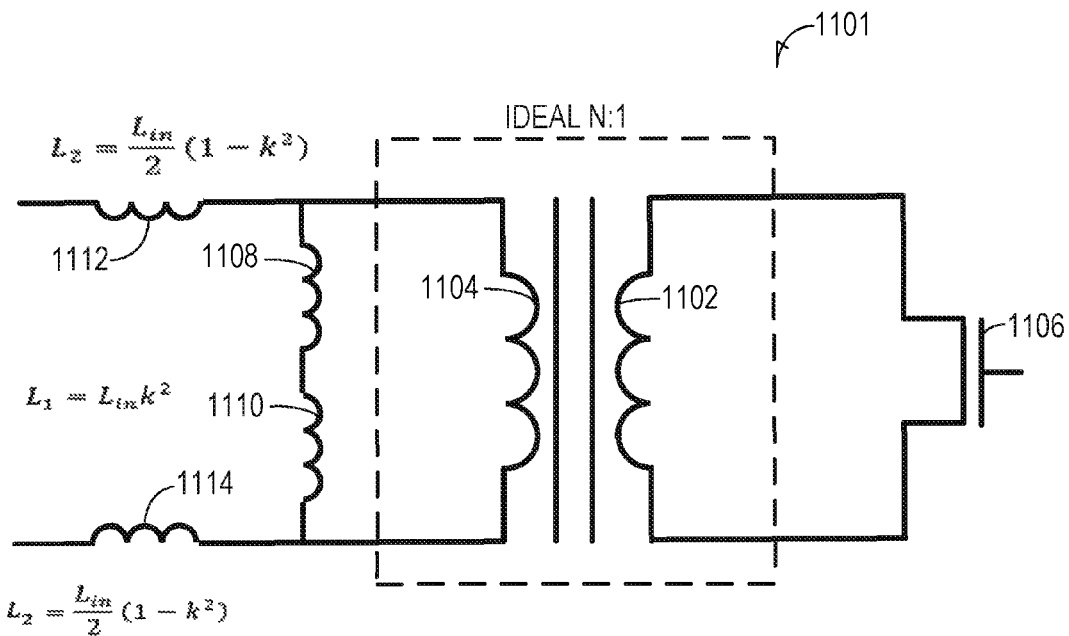
FIG. 11A illustrates an inductor modeled as an ideal transformer with series and parallel inductances connected to one winding and a transistor connected at the other winding, according to some aspects.

FIG. 11A illustrates an inductor modeled as an ideal transformer with N:1, with series and parallel inductances connected to one winding and a transistor connected at the other winding, according to some aspects.

Figure 11B:
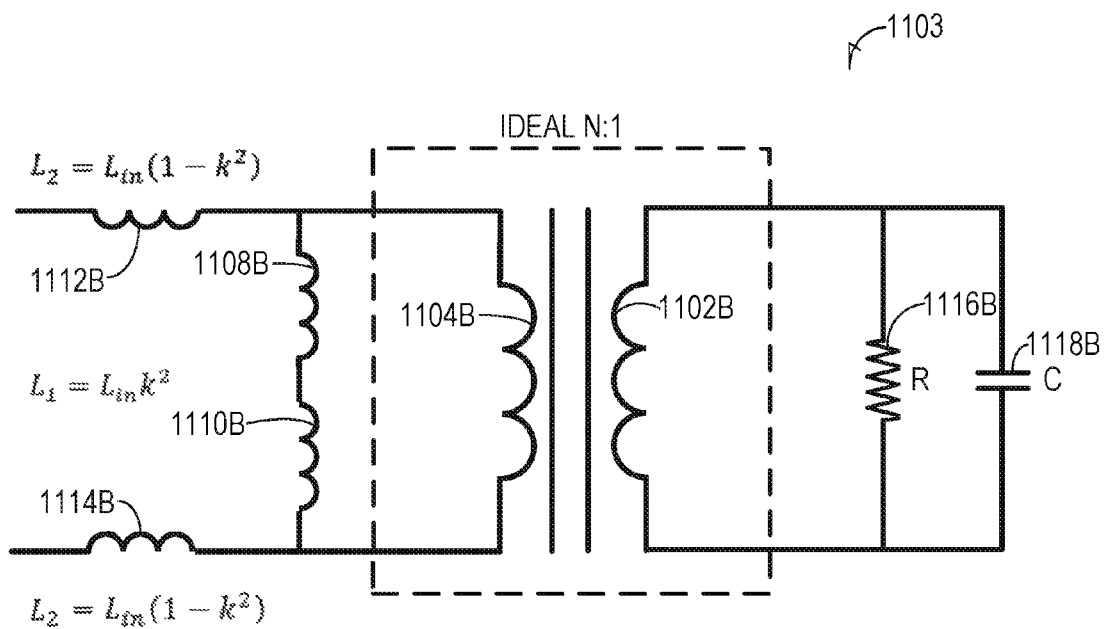
FIG. 11B illustrates the ideal transformer of FIG. 11A with the transistor shorting the inner loop, according to some aspects.

FIG. 11B illustrates the ideal transformer 1101 of FIG. 11A with the transistor 1106 shorting the inner loop 1002, according to some aspects. When the transistor 1106 of FIG. 11A shorts the inner loop 1002, then the circuit can be modelled as a resistor 1116 in parallel with a capacitor 1118 as seen in FIG. 11B.

Figure 11C:
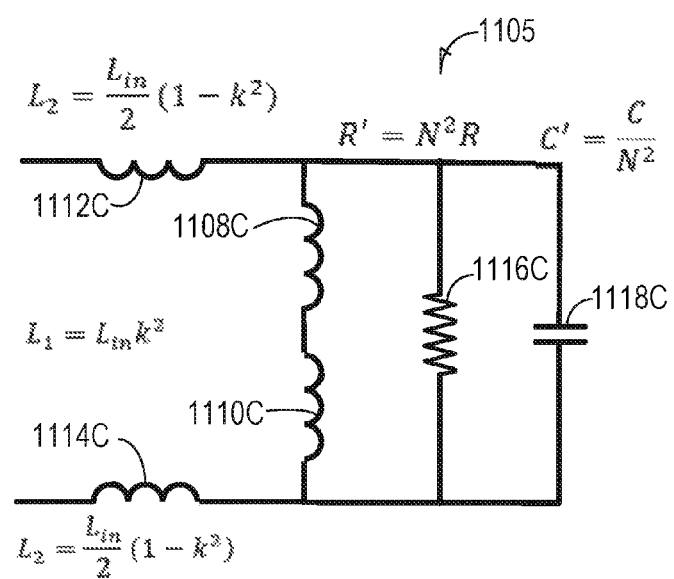
FIG. 11C illustrates the ideal transformer with the shorted inner loop as illustrated in FIG. 11B, with the transformer replaced with an effective value for the resistor and capacitor after transformation, according to some aspects.

FIG. 11C illustrates an ideal transformer with the shorted inner loop as illustrated in FIG. 11B, with the transformer replaced with an effective value for the resistor 1116C and capacitor 1118C after transformation, according to some aspects. In other words, replacing the transformer of FIG. 11B with an effective value for the resistor 1116C and capacitor 1118C results in the circuit of FIG. 11C.

In FIGS. 11A-11C, $$N = \frac{1}{k}\sqrt{\frac{L_{out}}{L_{in}}},$$

and $L_{out}$ and $L_{in}$ are the inductances of the current loop and the main inductor, respectively, k is coupling and ω is the frequency in radians. In the case of a low resistance, the effective inductance can be approximated as:

$$L_{eff} \approx L_{in}(1-k^2) + \frac{L_{out}R^2(L_{out} - \omega^2 L_{in}^2 k^4 C)}{\omega^2 k^4 L_{in}^2} \quad (6)$$

For an ideal switch this is further reduced to:

$$L_{eff} \approx L_{in}(1-k^2) \quad (7)$$

which makes the effective inductance smaller as the coupling increases.

Since the additional current loops are floating, when the transistor is open then there is essentially no induced current in the loop and therefore essentially no coupling, so k goes to 0 and we get the main inductor without change. Prior art implementations significantly affect the inductor, which is a negative effect, whereas in the disclosed subject matter this unwanted effect is avoided. Therefore it is possible to tune the inductance with little or no effect on its value by shorting the current loops as may be desired. It is possible to design a fine or coarse tuning by changing the coupling or the switch parameters. For example it is possible to short or open the loops separately at different metals.

Figure 12A:
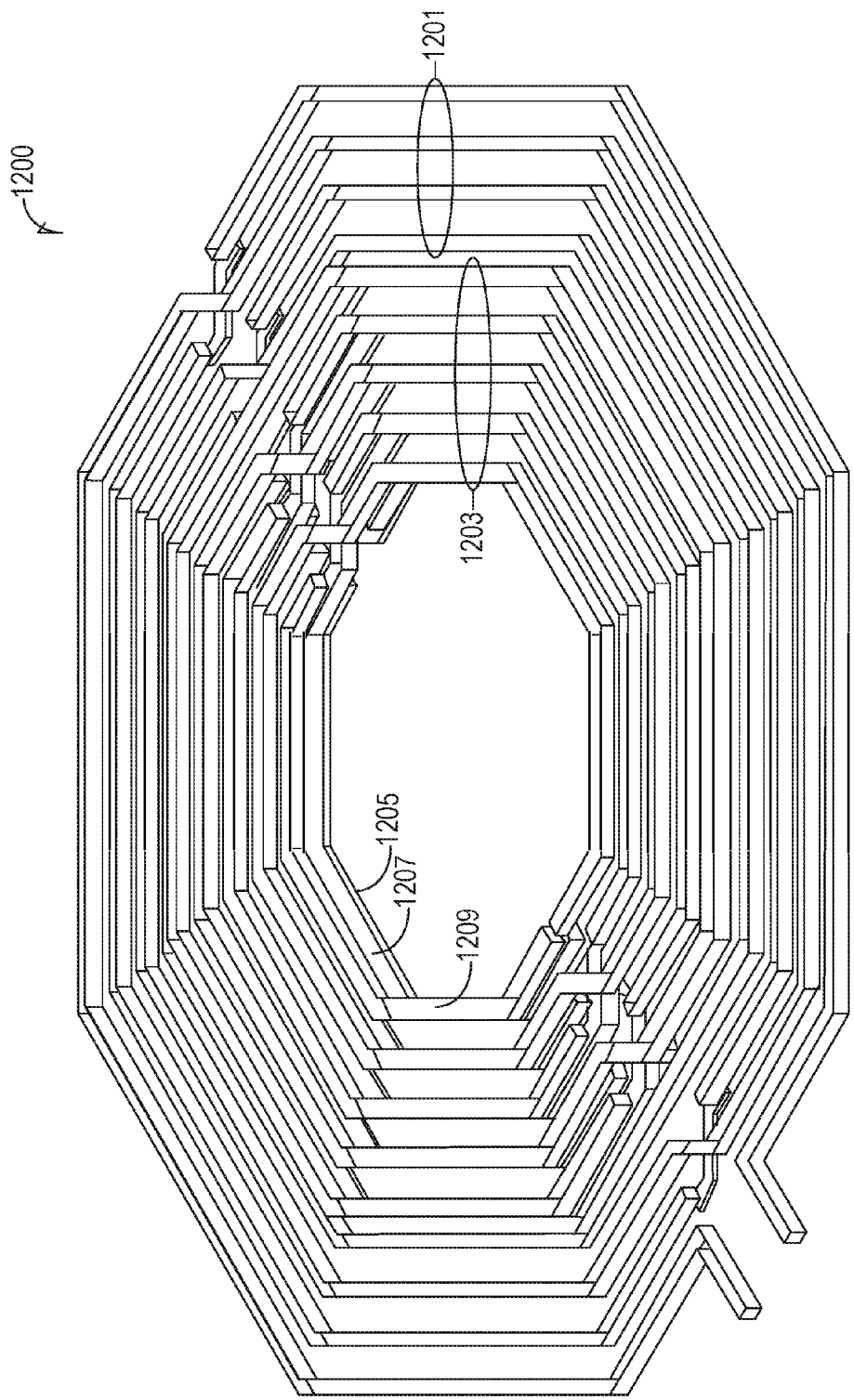
FIG. 12A illustrates an inductor implementation in which the inductor comprises five outer loops and four tuning loops, where the tuning loops are the inner loops that use three different metals, according to some aspects.

FIG. 12A illustrates an inductor implementation in which the inductor 1200 comprises five outer loops 1201, which may be considered the main inductor, and four tuning loops 1203, where the tuning loops 1203 are the inner floating loop levels 1205, 1207 and 1209, each of which may use a different metal, according to some aspects. The five inner windings in some aspects are not connected to the four outer windings. The five inner windings are each independent of the other and by shorting one or more of the inner windings 1205, 1207 and 1209, the inductance of the outer inductor 1201 can be lowered, by an amount depending on the type of metal, thus making the inductor configurable to lower the inductance as may be desired. In other words, the inner windings can be shorted independently in any combination. By shorting a loop is meant closing the articular loop so that the impedance of the loop is low. Shorting one or more of the inner windings changes the amount of current passing through the five current windings. This essentially modulates the resistance of the current windings and therefore controls the amount of parasitic magnetic flux. In other words, according to Lenz's law, if the current windings are not shorted, essentially no current will flow and no flux will be generated. If one of the metal windings, say 1205, is shorted, say by a switch that closes the winding on itself, an additional magnetic field will be generated, and an additional flux will be added to that of the main conductor 1201 so that superposition of flux yields an inductance greater than the inductance of the main inductor. If a second current winding, say 1207, is shorted, there will be still additional flux generated, again by superposition yielding an additional inductance. This also occurs if the third current winding 1209 is also shorted, with additional flus again yielding additional inductance. Stated another way, there can be three different values of inductance depending on which current windings are shorted, without adding any additional area to the inductor. While current windings of differing metals may be used, the disclosed subject matter is not limited to this, and the current loops could be all of one metal, as well as a combination of metals. The saving of additional area as disclosed is important in wireless communication products where semiconductor area is at a premium. A switch for shorting inductor coils is seen in FIG. 12B, below.

Figure 12B:
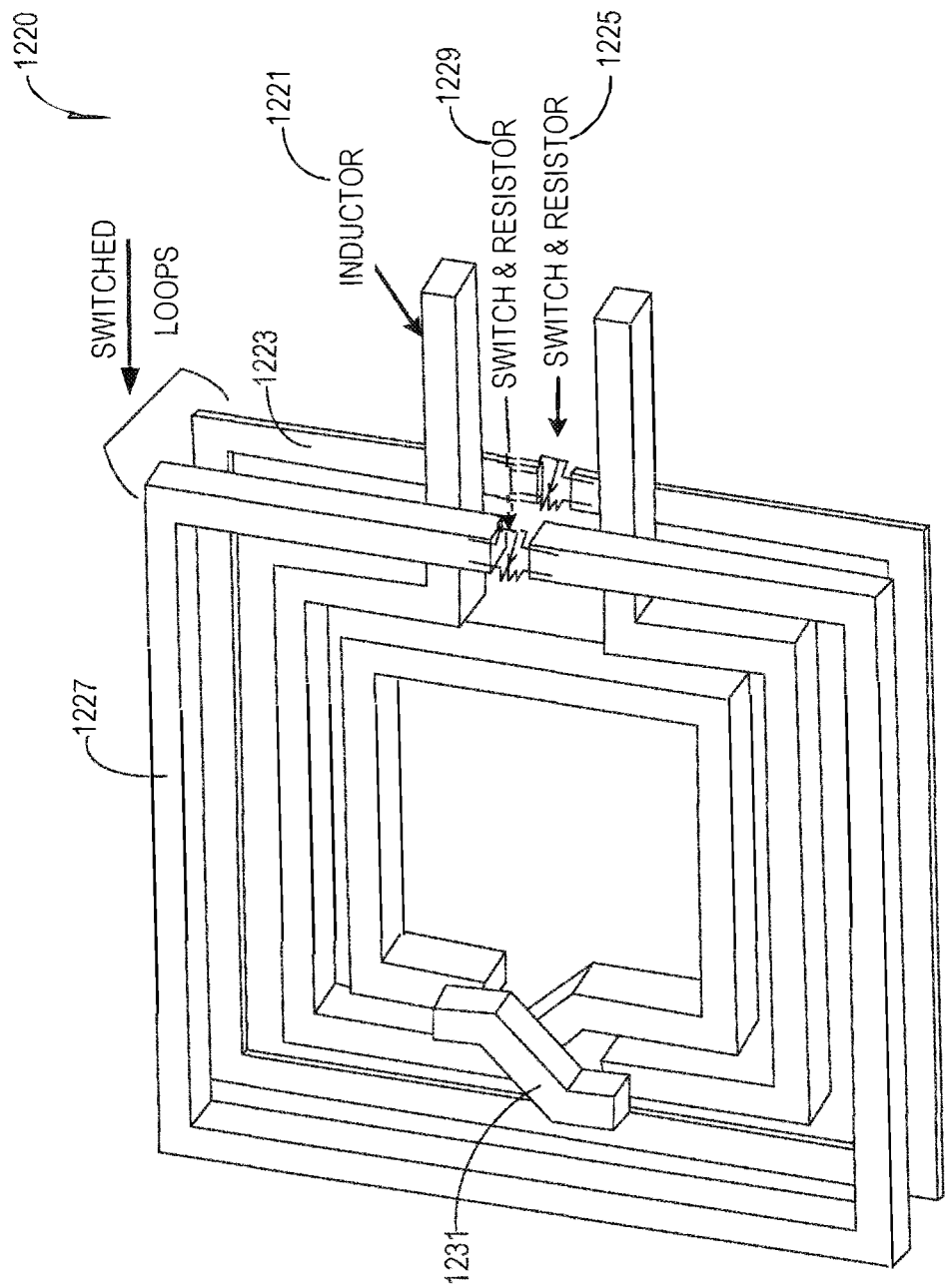
FIG. 12B illustrates another inductor implementation, which may utilize shielding, according to some aspects.

FIG. 12B illustrates another inductor implementation, which may utilize shielding, according to some aspects. In FIG. 12B, the main winding of an inductor is seen at 1221. A second winding 1223, which in some aspects has switch 1225, which may be an appropriate transistor switch, and may be located on one side of main inductor coil 1221. A third winding 1227 may be located on the opposite side of main winding 1221. Third winding 1227, like second winding 1223 may include a switch 1229. In some aspects, second winding 1223 may shorted by switch 1225 and the inductance of the main inductor 1221 is changed, as explained with respect to FIG. 12A. If the switch 1229 shorts third winding 1227, the inductance of inductor 1221 is similarly further changed. Thus the ability to tune, or vary, inductance is apparent. Therefore, the disclosed subject matter may short current loops located in essentially the same plane as the main loop as in FIG. 12A, in some aspects. The disclosed subject matter may also short current loops outside the plane of the main loop as indicated in FIG. 12B, in other aspects, where current loops 1223 and 1227 are outside the plane of the main loop 1221. In this example the shorted current loops may be in planes parallel to the main loop so that in some devices Z-height can be used instead of using additional X-Y area. In some aspects, a resistor can be used in parallel with the switch, as indicated at 1225 and 1229, to flatten the Q with a resultant more flattened gain response, for example when this method is used in an amplifier. In some aspects, element 1231 may be used to prevent a short when having more than one winding. It is sometimes called an under path. It does not necessarily change the aspect of shorting current loops outside the plane of the main loop. Having the main loop and the current loops stacked as in FIGS. 12A and 12B illustrates that the inductor need not take up additional area, which is at a premium in many, if not most, devices.

In transceivers and other integrated circuitry (IC), there is usually a metal IC shield structure that is used for shielding the integrated circuitry. The shield may also shield discrete circuitry. In another aspect, the inductor of FIG. 12A may be used within such an IC shield, and use additional shielding within the IC shield to apply shield for the inductor, without taking up any additional area or volume, since the additional shielding would be within the IC shield. In this aspect, the windings 1223 and 1227 of FIG. 12B may be implemented without the switches, 1225, 1229, respectively, in which case the windings 1223, 1227 act as a shield.

Figure 13:
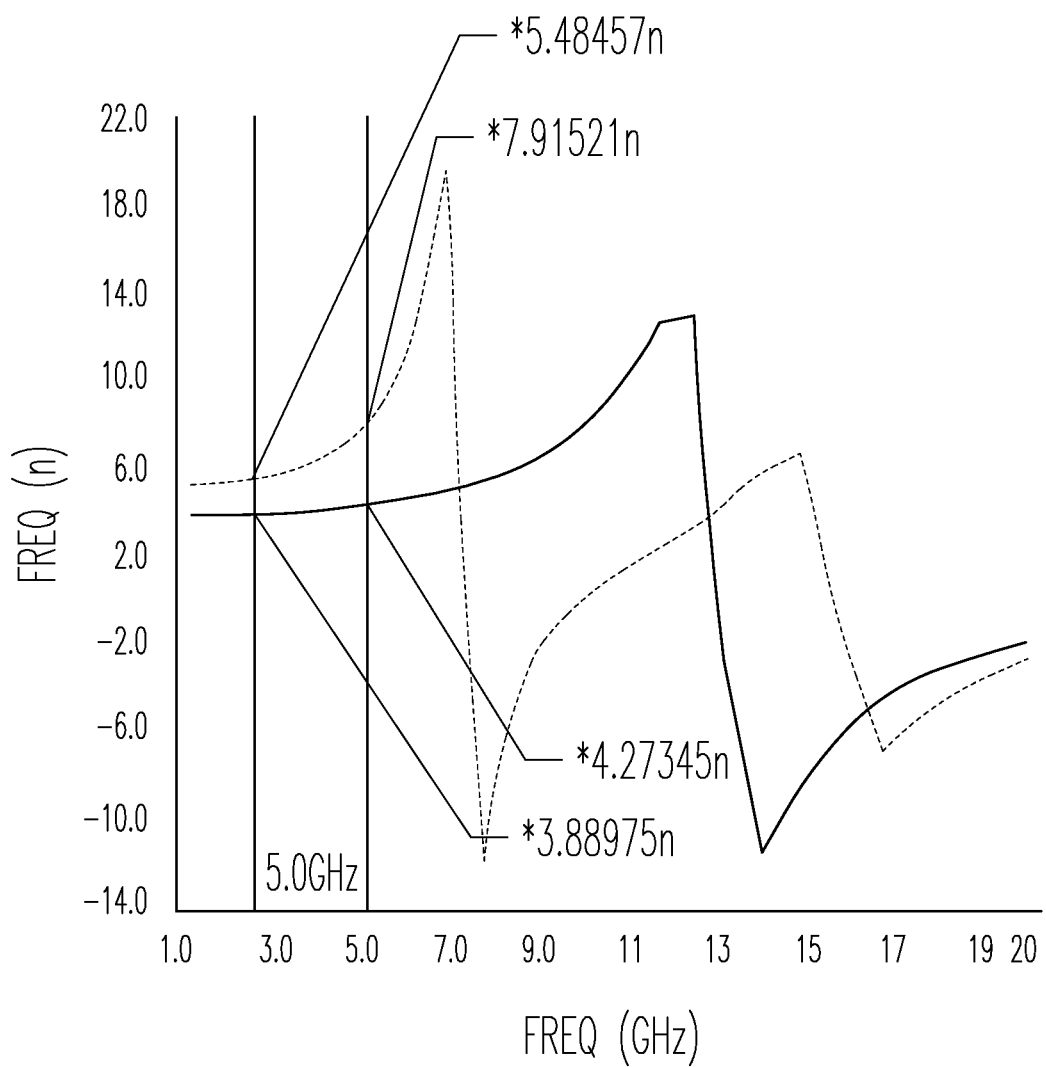
FIG. 13 is a graph, obtained via simulation, which illustrates inductance before current loop shorting and inductance after current loop shorting, according to some aspects.

Simulation using a complementary metal-oxide-semiconductor (CMOS) switch shows that the above-disclosed subject matter operates as described. FIG. 13 is a graph 1300, obtained via simulation, which illustrates inductance before current loop shorting and inductance after current loop shorting, according to some aspects. FIG. 13 illustrates that an inductor can be switched from 5.5 nH in graph 1301 before current loop shorting to 3.9 nH in graph 1303 after current loop shorting (an approximately 29% shift) using the above disclosure in the simulation.

Figure 14:
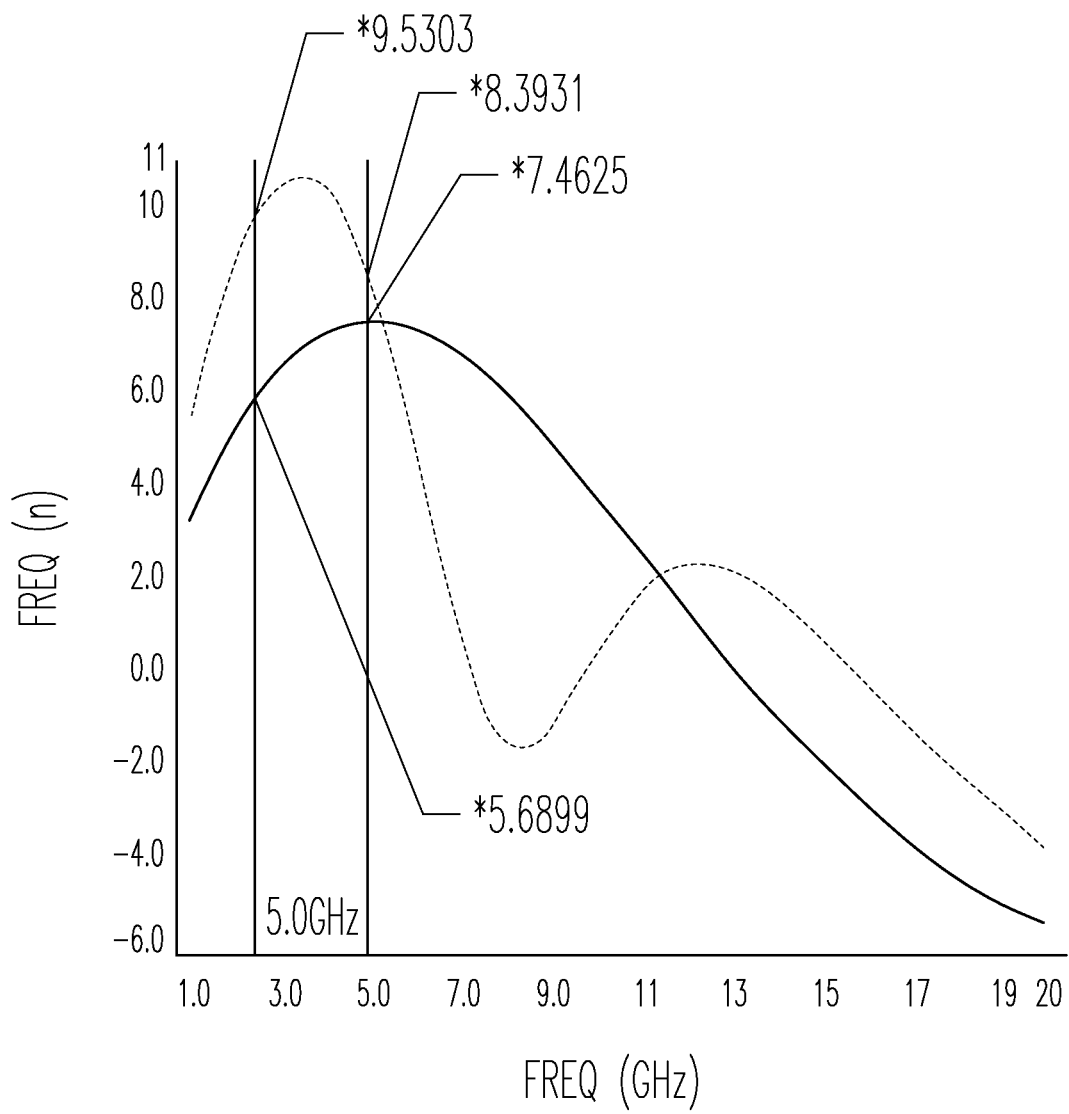
FIG. 14 is a graph, obtained via simulation, which illustrates inductance quality factor (Q) before current loop shorting and Q after current loop shorting, according to some aspects.

FIG. 14 is a graph 1400, obtained via simulation, which illustrates inductance quality factor (Q) before current loop shorting and Q after current loop shorting, according to some aspects. FIG. 14 illustrates that Q drops from 10.8 in graph 1401 before current loop shorting to 7.46 after current loop shorting, using the above disclosure in simulation. In other words, the resistance of the shorted current loop remains the same but because of current flow in the shorted current loop, Lenz's law indicates that the flux is lowered, lowering the Q. The SRF is twice the operating frequency for both FIG. 13 and FIG. 14. The FIG. 13 simulation is designed to operate at approximately 2.5 GHz, a low band (LB) of a wireless local area network (WLAN) and the FIG. 14 simulation is designed to operate at a high band (HB) of a WLAN, approximately 5 GHz). This allows for the design of a very wide band output buffer for measurement purposes spanning 1.8 GHz to 6.5 GHz on the same design, according to some aspects. The disclosed subject matter is much more efficient than large capacitor banks that have been used in the past, inasmuch as the Q loss for that method is more significant that the Q loss herein.

Tunable inductors can be used in almost every RF circuit, having impact on every aspect of a transceiver, whether it be multiband oscillators/amplifiers or wideband/tunable filters used for products such as cellular, Wi-Fi, BT, 5G, WiGig or optical communication. Prior art techniques do not allow for a smooth response in frequency and degrade performance with respect to the unaltered (no configurability) circuit, whereas the disclosed subject matter allows having a very small degradation with respect to the vast configurability achievable.

Figure 15:
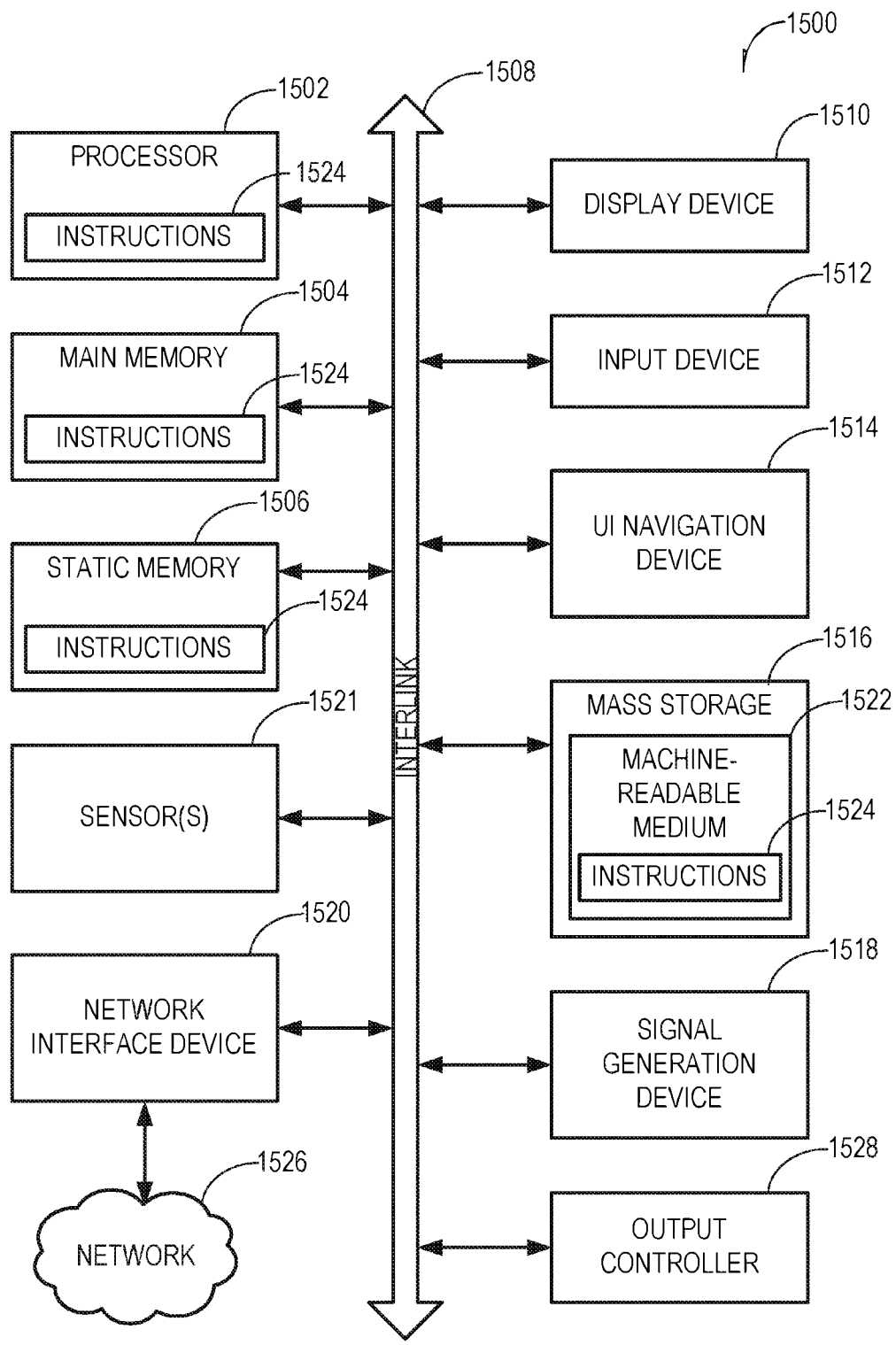
FIG. 15 illustrates an example machine in accordance with some aspects of the disclosure.

FIG. 15 illustrates a block diagram of an example machine in accordance with some aspects of the disclosure. The machine 1500 is an example machine upon which any one or more of the techniques and/or methodologies discussed herein may be performed. In alternative aspects of the disclosure, the machine 1500 may operate as a standalone device or may be connected (e.g., networked) to other machines. In a networked deployment, the machine 1500 may operate in the capacity of a server machine, a client machine, or both in server-network environments. In an example, the machine 1500 may act as a peer machine in peer-to-peer (P2P) (or other distributed) network environment. The machine 1500 may be a mobile device, such as the mobile device 100 of FIG. 1A, which may be user equipment (UE). The machine 1500 may also be a STA, an evolved Node B (eNB), a base station such as infrastructure equipment radio head 200 of FIG. 1B, a personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 1500 may include a hardware processor 1502 (e.g., a central processing unit (CPU), a graphics processing unit (GPU), a hardware processor core, or any combination thereof), a main memory 1504 and a static memory 1506, some or all of which may communicate with each other via an interlink (e.g., bus) 1508. The machine 1500 may further include a display unit 1510, an alphanumeric input device 1512 (e.g., a keyboard), and a user interface (UI) navigation device 1514 (e.g., a mouse). In an example, the display unit 1510, input device 1512 and UI navigation device 1514 may be a touch screen display. The machine 1500 may additionally include a storage device (e.g., drive unit) 1516, a signal generation device 1518 (e.g., a speaker), a network interface device 1520, and one or more sensors 1521, such as a global positioning system (GPS) sensor, compass, accelerometer, or other sensor. The machine 1500 may include an output controller 1528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1516 may include a machine readable medium 1522 on which is stored one or more sets of data structures or instructions 1524 (e.g., software) embodying or utilized by any one or more of the techniques or functions described herein. The instructions 1524 may also reside, completely or at least partially, within the main memory 1504, within static memory 1506, or within the hardware processor 1502 during execution thereof by the machine 1500. In an example, one or any combination of the hardware processor 1502, the main memory 1504, the static memory 1506, or the storage device 1516 may constitute machine readable media. In some aspects of the disclosure, the machine readable medium may be or may include a non-transitory computer-readable storage medium.

While the machine readable medium 1522 is illustrated as a single medium, the term "machine readable medium" may include a single medium or multiple media (e.g., a centralized or distributed database, and/or associated caches and servers) configured to store the one or more instructions 1524. The term "machine readable medium" may include any medium that is capable of storing, encoding, or carrying instructions for execution by the machine 1500 and that cause the machine 1500 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions 1524 may further be transmitted or received over a communications network 1526 using a transmission medium via the network interface device 1520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UNITS) family of standards, peer-to-peer (P2P) networks, among others. In an example, the network interface device 1520 may include one or more physical jacks (e.g., Ethernet, coaxial, or phone jacks) or one or more antennas to connect to the communications network 1526. In an example, the network interface device 1520 may include a plurality of antennas to wirelessly communicate using at least one of single-input multiple-output (SIMO), multiple-input multiple-output (MIMO), or multiple-input single-output (MISO) techniques. In some examples, the network interface device 1520 may wirelessly communicate using Multiple User MIMO techniques. The term "transmission medium" shall be taken to include any intangible medium that is capable of storing, encoding or carrying instructions for execution by the machine 1500, and includes digital or analog communications signals or other intangible medium to facilitate communication of such software.

Aspects of the disclosure may be implemented in one or a combination of hardware, firmware and software. Aspects of the disclosure may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some aspects of the disclosure may include one or more processors and may be configured with instructions stored on a computer-readable storage device.

EXAMPLES

Example 1 is a switchable inductor comprising: a primary winding having a boundary configured in shape of a figure eight; a plurality of secondary windings arranged asymmetrically within the boundary of the primary winding; and a plurality of switches, each switch configurable to an open configuration and to a closed configuration and arranged in series with a respective one of the plurality of secondary windings to change inductance of the switchable inductor based on a closed or an open configuration.

In Example 2, the subject matter of Example 1 optionally includes wherein the primary winding having a boundary configured in the shape of a figure eight, and wherein the shape comprises two loops, and a same number of the plurality of secondary windings is arranged within each loop.

In Example 3, the subject matter of any one or more of Examples 1-2 optionally include wherein the switchable inductor comprises part of a tank circuit of a radio frequency (RF) circuit, and the switches of the plurality of secondary windings are each configurable to the open configuration and to the closed configuration to change the inductance of the switchable inductor.

In Example 4, the subject matter of Example 3 optionally includes wherein the RF circuit comprises an oscillator, and a change of the configuration of one of the plurality of switches from an open configuration to a closed configuration changes the frequency of the oscillator.

In Example 5, the subject matter of Example 4 optionally includes wherein the oscillator is a voltage controlled oscillator (VCO) or a digitally controlled oscillator (DCO) and the plurality of switches are switched by control signals.

In Example 6, the subject matter of Example 5 optionally includes wherein automatic frequency control circuitry is configured to provide the control signals to each switch to configure each switch to an open configuration simultaneously and to configure each switch to a closed configuration simultaneously.

In Example 7, the subject matter of any one or more of Examples 1-6 optionally include wherein each of the secondary windings is physically spaced from another secondary winding and from the primary winding, and a variation of the physical spacing between one or more of the secondary windings and the primary winding changes the effective inductance of the switchable inductor.

In Example 8, the subject matter of any one or more of Examples 1-7 optionally include wherein the primary winding includes a center tap, wherein each switch comprises an inverter; and wherein the center tap of the primary winding is configured to supply power for each inverter.

In Example 9, the subject matter of Example 8 optionally includes wherein each respective secondary winding includes a center tap, and each inverter is configured to provide direct current (DC) biasing of the switch of the respective secondary winding via the center tap of the respective secondary winding.

Example 10 is an apparatus of a mobile device, the apparatus comprising: a digitally controlled oscillator (DCO) configured to generate oscillation signals; and automatic frequency control (AFC) circuitry configured to provide control signals to the DCO for frequency selection of the oscillation signals, wherein the DCO comprises: an inductor that includes a primary winding having a boundary configured in shape of a figure eight; a plurality of secondary windings arranged asymmetrically within the boundary of the primary winding, and a plurality of switches responsive to the control signals, each switch configurable to an open configuration and to a closed configuration and arranged in series with a respective one of the plurality of secondary windings to change inductance of the switchable inductor based on a closed or an open configuration.

In Example 11, the subject matter of Example 10 optionally includes wherein the primary winding having a boundary configured in the shape of a figure eight, wherein the shape comprises two loops, and a same number of the secondary windings is arranged within each loop.

In Example 12, the subject matter of any one or more of Examples 10-11 optionally include wherein the switchable inductor comprises part of a tank circuit of the DCO, and the plurality of switches are each configurable to the open configuration and to the closed configuration to change the effective inductance of the switchable inductor.

In Example 13, the subject matter of Example 12 optionally includes wherein a change of the configuration of one of the plurality of switches from an open configuration to a closed configuration changes the frequency of the DCO.

In Example 14, the subject matter of any one or more of Examples 10-13 optionally include wherein each switch of the plurality of secondary windings is controlled by the AFC to be configured to an open configuration simultaneously and to be configured to a closed configuration simultaneously.

In Example 15, the subject matter of any one or more of Examples 10-14 optionally include wherein each of the secondary windings within the boundary of the primary winding is physically spaced from another secondary winding and from the primary winding, and a variation in the physical spacing between one or more of the secondary windings and the primary winding changes the effective inductance of the switchable inductor.

In Example 16, the subject matter of any one or more of Examples 10-15 optionally include wherein the primary winding includes a center tap, wherein each switch comprises an inverter, and wherein power for each inventor is supplied by the center tap of the primary winding.

In Example 17, the subject matter of Example 16 optionally includes wherein each respective secondary winding includes a center tap, and each inverter provides DC biasing of the switch of the respective secondary winding via the center tap of the respective secondary winding.

Example 18 is an apparatus of a mobile device, the apparatus comprising: tunable circuitry; and processing circuitry, wherein the tunable circuitry comprises a variable inductor that has at least one main loop, and at least one floating secondary loop, the at least one secondary loop comprises a switch that is configured to short the at least one secondary loop into at least one shorted loop to vary the inductance of the variable inductor and tune the tunable circuitry, and the processing circuitry comprises an automatic frequency control circuit that provides control signals for the switch of the at least one secondary loop to vary the inductance of the variable inductor and tune the tunable circuitry.

In Example 19, the subject matter of Example 18 optionally includes wherein the least one shorted loop is in the plane of the at least one main loop or the at least one shorted loop is outside the plane of the at least one main loop.

In Example 20, the subject matter of Example 19 optionally includes wherein the plane that is outside the plane of the at least one main loop is parallel to the plane of the at least one main loop.

In Example 21, the subject matter of any one or more of Examples 18-20 optionally include wherein the configuration into at least one shorted loop induces current flow in the at least one shorted loop, and the induced current flow varies the inductance value of the variable inductor.

In Example 22, the subject matter of any one or more of Examples 18-21 optionally include wherein the configuration into at least one shorted loop induces current flow in the shorted loop, and the induced current flow affects the quality factor (Q) of the variable inductor.

In Example 23, the subject matter of any one or more of Examples 18-22 optionally include wherein the at least one shorted secondary loop varies the inductance value of the variable inductor.

In Example 24, the subject matter of any one or more of Examples 18-23 optionally include wherein the at least one main loop comprises a plurality of main loops.

In Example 25, the subject matter of any one or more of Examples 18-24 optionally include wherein the at least one secondary loop comprises a plurality of secondary loops each comprising a respective switch.

In Example 26, the subject matter of Example 25 optionally includes wherein at least two of the plurality of secondary loops comprise different metals, and wherein each metal results in a different variation of inductance value of the variable inductor when the switch of the secondary loop is closed.

In Example 27, the subject matter of any one or more of Examples 25-26 optionally include wherein the tunable circuitry comprises an electronic amplifier, and wherein at least one of the plurality of secondary loops includes a resistor associated with the respective switch to flatten a response of the amplifier.

In Example 28, the subject matter of any one or more of Examples 18-27 optionally include wherein the tunable circuitry comprises a digitally controlled oscillator (DCO).

In Example 29, the subject matter of any one or more of Examples 18-28 optionally include wherein the tunable circuitry comprises a filter.

In Example 30, the subject matter of any one or more of Examples 18-29 optionally include wherein the tunable circuitry comprises an impedance matching network.

In Example 31, the subject matter can include, or can optionally be combined with any portion or combination of, any portions of any one or more of Examples 1 through 30 to include, subject matter that can include means for performing any one or more of the functions of Examples 1 through 30, or a machine-readable medium including instructions that, when performed by a machine, cause the machine to perform any one or more of the functions of Examples 1 through 30.

Examples as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

What is claimed is:

1. A switchable inductor comprising:
   a primary winding having a boundary configured in shape of a figure eight having first and second non-overlapping loops;
   a plurality of secondary windings arranged asymmetrically within the boundary of the primary winding such that a distance between each secondary winding and the primary winding is not constant; and
   a plurality of switches, each switch configurable to an open configuration and to a closed configuration and arranged in series with a respective one of the plurality of secondary windings to change inductance of the switchable inductor based on a closed or an open configuration,
   wherein a first set of the secondary windings are arranged with the first loop and a second set of the secondary windings are arranged in the second loop wherein each secondary winding of the first loop has a corresponding secondary winding in the second loop, and wherein the switches of the corresponding secondary windings of the first and second loops configured to be switched on and off simultaneously.

2. The switchable inductor of claim 1 wherein the switchable inductor comprises part of a tank circuit of a radio frequency (RF) circuit, and the switches of the plurality of secondary windings are each configurable to the open configuration and to the closed configuration to change the inductance of the switchable inductor.

3. The switchable inductor of claim 2 wherein the RF circuit comprises an oscillator, and a change of the configuration of one of the plurality of switches from an open configuration to a closed configuration changes the frequency of the oscillator.

4. The switchable inductor of claim 3 wherein the oscillator is a voltage controlled oscillator (VCO) or a digitally controlled oscillator (DCO) and the plurality of switches are switched by control signals, wherein automatic frequency control circuitry is configured to provide the control signals to each switch to configure each switch to an open configuration simultaneously and to configure each switch to a closed configuration simultaneously.

5. The switchable inductor of claim 1 wherein each of the secondary windings is physically spaced from another secondary winding and from the primary winding, and a variation of the physical spacing between one or more of the secondary windings and the primary winding changes the effective inductance of the switchable inductor.

6. A switchable inductor comprising:
   a primary winding having a boundary configured in shape of a figure eight;
   a plurality of secondary windings arranged asymmetrically within the boundary of the primary winding; and
   a plurality of switches, each switch configurable to an open configuration and to a closed configuration and arranged in series with a respective one of the plurality of secondary windings to change inductance of the switchable inductor based on a closed or an open configuration,
   wherein the primary winding includes a center tap, wherein each switch comprises an inverter, and wherein the center tap of the primary winding is configured to supply power for each inverter, wherein each respective secondary winding includes a center tap, and each inverter is configured to provide direct current (DC) biasing of the switch of the respective secondary winding via the center tap of the respective secondary winding.

7. An apparatus of a mobile device, the apparatus comprising:
   a digitally controlled oscillator (DCO) configured to generate oscillation signals; and
   automatic frequency control (AFC) circuitry configured to provide control signals to the DCO for frequency selection of the oscillation signals, wherein the DCO comprises:
   an inductor that includes a primary winding having a boundary configured in shape of a figure eight having first and second non-overlapping loops;
   a plurality of secondary windings arranged asymmetrically within the boundary of the primary winding such that a distance between each secondary winding and the primary winding is not constant, and
   a plurality of switches responsive to the control signals, each switch configurable to an open configuration and to a closed configuration and arranged in series with a respective one of the plurality of secondary windings to change inductance of the switchable inductor based on a closed or an open configuration, wherein a first set of the secondary windings are arranged with the first loop and a second set of the secondary windings are arranged in the second loop wherein each secondary winding of the first loop has a corresponding secondary winding in the second loop, and wherein the switches of the corresponding secondary windings of the first and second loops configured to be switched on and off simultaneously.

8. The apparatus of a mobile device of claim 7 wherein the switchable inductor comprises part of a tank circuit of the DCO, and the plurality of switches are each configurable to the open configuration and to the closed configuration to change the effective inductance of the switchable inductor, wherein a change of the configuration of one of the plurality of switches from an open configuration to a closed configuration changes the frequency of the DCO.

9. The apparatus of a mobile device of claim 7 wherein each switch of the plurality of secondary windings is controlled by the AFC to be configured to an open configuration simultaneously and to be configured to a closed configuration simultaneously.

10. The apparatus of a mobile device of claim 7 wherein each of the secondary windings within the boundary of the primary winding is physically spaced from another secondary winding and from the primary winding, and a variation in the physical spacing between one or more of the secondary windings and the primary winding changes the effective inductance of the switchable inductor.

11. An apparatus of a mobile device, the apparatus comprising:

a digitally controlled oscillator (DCO) configured to generate oscillation signals; and automatic frequency control (AFC) circuitry configured to provide control signals to the DCO for frequency selection of the oscillation signals, wherein the DCO comprises:

an inductor that includes a primary winding having a boundary configured in shape of a figure eight;

a plurality of secondary windings arranged asymmetrically within the boundary of the primary winding, and a plurality of switches responsive to the control signals, each switch configurable to an open configuration and to a closed configuration and arranged in series with a respective one of the plurality of secondary windings to change inductance of the switchable inductor based on a closed or an open configuration, wherein the primary winding includes a center tap, wherein each switch comprises an inverter, and wherein power for each inventor is supplied by the center tap of the primary winding, wherein each respective secondary winding includes a center tap, and each inverter provides DC biasing of the switch of the respective secondary winding via the center tap of the respective secondary winding.

* * * * *

UNITED STATES PATENT AND TRADEMARK OFFICE
CERTIFICATE OF CORRECTION

PATENT NO. : 11,552,594 B2
APPLICATION NO. : 16/957349
DATED : January 10, 2023
INVENTOR(S) : Broussev et al.

Page 1 of 1

It is certified that error appears in the above-identified patent and that said Letters Patent is hereby corrected as shown below:

On the Title Page

In item (72), in "Inventors", in Column 1, Line 2, delete "Petch" and insert --Petah-- therefor Signed and Sealed this
Sixth Day of February, 2024

Katherine Kelly Vidal
*Director of the United States Patent and Trademark Office*